(12) United States Patent
Shin

(10) Patent No.: US 7,851,329 B2
(45) Date of Patent: Dec. 14, 2010

(54) SEMICONDUCTOR DEVICE HAVING EDMOS TRANSISTOR AND METHOD FOR MANUFACTURING THE SAME

(75) Inventor: Hyun-Soo Shin, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 223 days.

(21) Appl. No.: 11/955,235

(22) Filed: Dec. 12, 2007

(65) Prior Publication Data

US 2008/0157203 A1      Jul. 3, 2008

(30) Foreign Application Priority Data

Dec. 29, 2006      (KR) .................... 10-2006-0137337

(51) Int. Cl.
*H01L 21/76* (2006.01)
(52) U.S. Cl. ................ 438/439; 438/301; 438/305; 438/306; 438/307; 438/437; 257/334; 257/336; 257/E21.427; 257/E29.04; 257/E29.268
(58) Field of Classification Search ............... 257/336, 257/334, E21.427, E29.04, E29.268; 438/301, 438/305, 306, 307, 437, 439
See application file for complete search history.

(56) References Cited

U.S. PATENT DOCUMENTS

| 6,531,355 | B2* | 3/2003 | Mosher et al. ............ 438/227 |
| 2003/0003669 | A1* | 1/2003 | Bromberger et al. ........ 438/301 |
| 2003/0190789 | A1* | 10/2003 | Salama et al. ............. 438/286 |
| 2005/0062102 | A1* | 3/2005 | Dudek et al. .............. 257/335 |

* cited by examiner

*Primary Examiner*—Long K Tran
(74) *Attorney, Agent, or Firm*—Sherr & Vaughn, PLLC

(57) ABSTRACT

A semiconductor device having an EDMOS transistor and a method for forming the same are provided. The semiconductor device includes source and drain regions formed separately in a semiconductor substrate, a first gate insulating layer filling a trench formed in the substrate between the source and drain regions, the first gate insulating layer being adjacent to the drain region and separated from the source region, a second gate insulating layer formed over the substrate between the first gate insulating layer and the source region, the second gate insulating layer being thinner than the first gate insulating layer, a gate electrode formed over the first and second gate insulating layers, and a doped drift region formed in the substrate under the first gate insulating layer, the doped drift region being in contact with the drain region. This reduces the planar area of the EDMOS transistor, thereby achieving highly integrated semiconductor devices.

5 Claims, 3 Drawing Sheets

SEMICONDUCTOR DEVICE HAVING EDMOS TRANSISTOR AND METHOD FOR MANUFACTURING THE SAME

The present application claims priority under 35 U.S.C. 119 to Korean Patent Application No. 10-2006-0137337, filed on Dec. 29, 2006, which is hereby incorporated by reference in its entirety.

BACKGROUND

Embodiments relate to a semiconductor device and a method for manufacturing the same, and more particularly, to an Extended Drain Metal Oxide Semiconductor (EDMOS) transistor device and method of manufacture. One of the components a semiconductor device may require is a transistor that controls high voltages. An EDMOS transistor may be used for this purpose. The EDMOS transistor has a relatively thick oxide layer between the gate and drain, for improving the insulating characteristics between the gate and drain to which the high voltage is applied. A related EDMOS transistor is explained with reference to FIG. 1.

Figure 1:
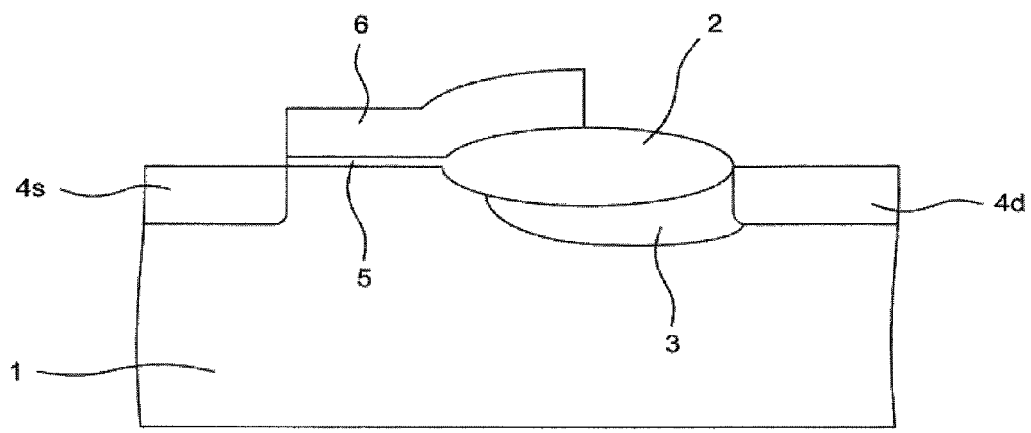

FIG. 1 is a cross-sectional view illustrating a method for forming a related EDMOS transistor. As shown in FIG. 1, a first gate oxide layer 2 is formed over a specific region of a semiconductor substrate 1. Specifically, the first gate oxide layer 2 is formed in the following manner. First, a nitride layer pattern having an opening is formed over the semiconductor substrate 1. The opening exposes the specific region of the semiconductor substrate 1. A thermal oxidation process is performed on the semiconductor substrate 1 including the nitride layer pattern to form the first gate oxide layer 2. The nitride layer pattern is then removed.

A doped drift region 3 is formed in the semiconductor substrate 1 under the first gate oxide layer 2. A source region 4s and a drain region 4d are formed in the semiconductor substrate 1 at both sides of the first gate oxide layer 2. The source region 4s is formed to be horizontally separated from the first gate oxide layer 2. The drain region 4d is formed to be adjacent to the first gate oxide layer 2. The doped drift region 3 and the drain region 4d are in contact with each other. The doped drift region 3 and the source and drain regions 4s and 4d are doped with the same type of impurities.

A second gate oxide layer 5 is formed over the semiconductor substrate 1 between the source region 4s and the first gate oxide layer 2. The second gate oxide layer 5 is formed to be thinner than the first gate oxide layer 2. A gate electrode 6 is formed over the first and second gate oxide layers 2 and 5. The gate electrode 6 is formed to cover a part of the first gate oxide layer 2. Accordingly, the gate electrode 6 and the drain region 4d are separated from each other.

In the EDMOS transistor formed according to the above method, the relatively thick first gate oxide layer 2 provides sufficient insulation between the gate electrode 6 and the drain region 4d even if a high voltage is applied to the drain region 4d. The doped drift region 3 is formed with a lower impurity concentration than the drain region 4d. This improves the breakdown voltage between the source region 4s and the drain region 4d.

However, the first gate oxide layer 2 in the related EDMOS transistor is formed through a LOCOS process using a nitride layer pattern. This causes a bird's beak phenomenon at the perimeter of the first gate oxide layer 2, which makes it difficult to reduce the planar area of the EDMOS transistor. However, reducing the planar area of the EDMOS transistor allows the integration density of semiconductor devices to increase.

SUMMARY

Embodiments relate to a semiconductor device having an EDMOS transistor and a method for forming the same, which are optimized for high integration. Embodiments relate to a semiconductor device having an EDMOS transistor and a method for forming the same, which can reduce the planar area of the EDMOS transistor.

Embodiments relate to a semiconductor device which may include a source region and a drain region formed separately in a semiconductor substrate. A first gate insulating layer may fill a trench formed in the semiconductor substrate between the source and drain regions. The first gate insulating layer may be adjacent to the drain region and separated from the source region. A second gate insulating layer may be formed over the semiconductor substrate between the first gate insulating layer and the source region, the second gate insulating layer being thinner than the first gate insulating layer. A gate electrode may be formed over the first and second gate insulating layers. A doped drift region may be formed in the semiconductor substrate under the first gate insulating layer, the doped drift region being in contact with the drain region.

Embodiments relate to a semiconductor device which may include a source region and a drain region formed separately in a semiconductor substrate. A doped drift region may be formed in the semiconductor substrate between the source and drain regions. The doped drift region may be separated from the source region and in contact with the drain region. A count doped region may be formed in the doped drift region. A gate insulating layer and a gate electrode may be sequentially deposited over the semiconductor substrate between the source and drain regions. The semiconductor substrate and the count doped region may be doped with a first conductivity type impurity and the source region, the drain region, and the doped drift region may be doped with a second conductivity type impurity.

In embodiments, the gate insulating layer or the count doped region may be formed to fill the trench between the gate electrode and the doped drift region. This allows a reduction in the planar area of the EDMOS transistor, thereby achieving more highly integrated semiconductor devices.

Embodiments relate to a method for forming a semiconductor device which may include forming a trench in a specific region of a semiconductor substrate and forming a first gate insulating layer to fill the trench. In this aspect, a doped drift region is formed in the semiconductor substrate under the first gate insulating layer. A source region and a drain region are formed in the semiconductor substrate at both sides of the first gate insulating layer. The source region is separated from the first gate insulating layer and the drain region is in contact with the doped drift region. A second gate insulating layer may be formed over the semiconductor substrate between the first gate insulating layer and the source region, the second gate insulating layer being thinner than the first gate insulating layer. A gate electrode may then be over the first and second gate insulating layers.

Embodiments relate to a method for forming a semiconductor device which may include forming a doped drift region doped with a second conductivity type impurity in a specific region of a semiconductor substrate doped with a first conductivity type impurity. A drain region may be formed in contact with the doped drift region and a source region separated from the doped drift region in the semiconductor substrate at both sides of the doped drift region. First conductivity type impurity ions may be implanted into the doped drift region to form a count doped region and a gate insulating layer and a gate electrode are then sequentially formed over the semiconductor substrate between the source and drain regions. The source and drain regions are doped with the second conductive impurity.

DRAWINGS

FIG. 1 is a cross-sectional view illustrating a method for forming a related EDMOS transistor.

Figure 2:
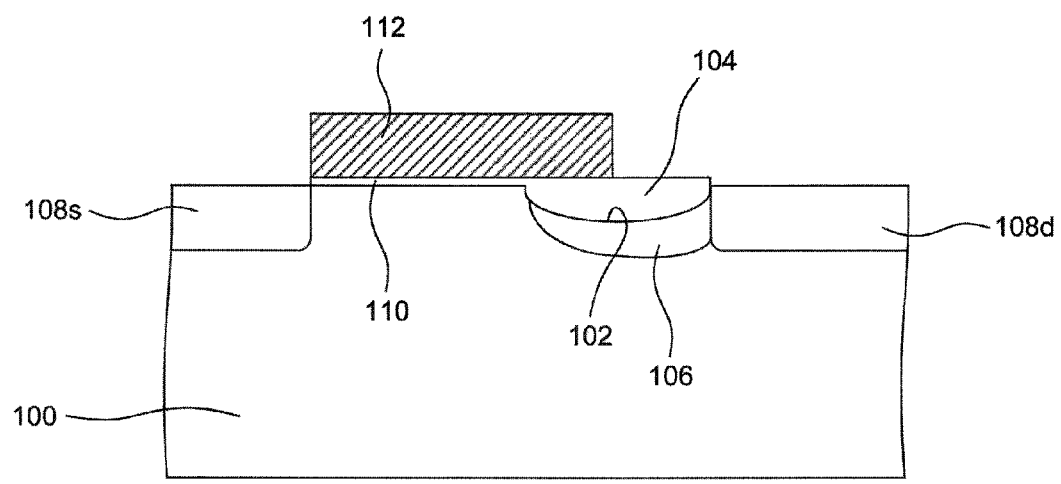

Example FIG. 2 is a cross-sectional view illustrating a semiconductor device having an EDMOS transistor according to embodiments.

Figure 3:
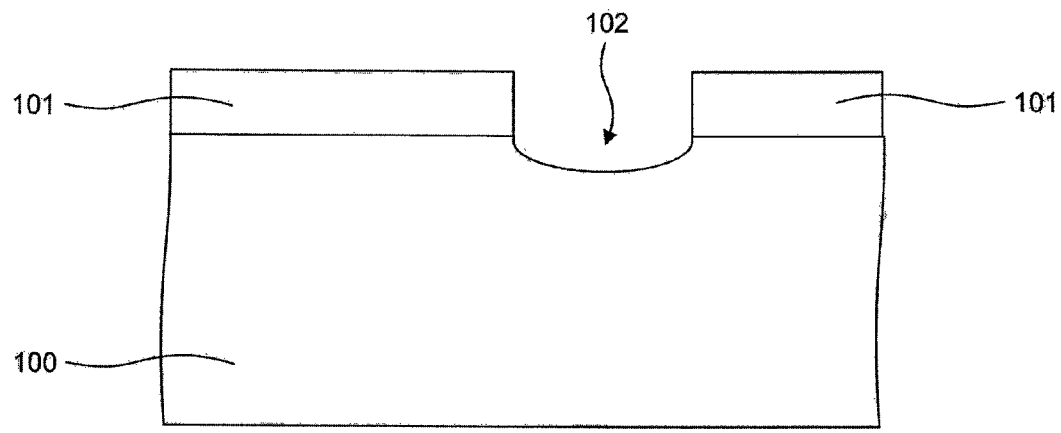
Figure 4:
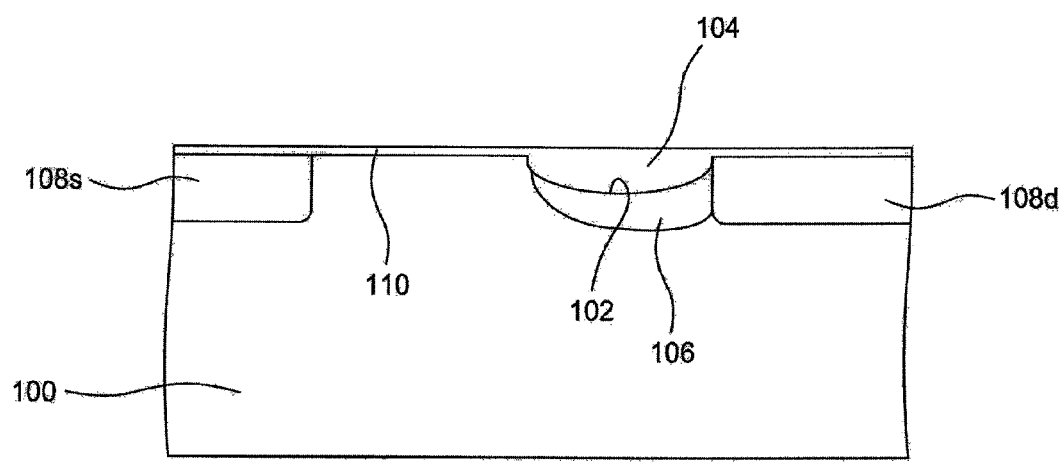

Example FIGS. 3 and 4 are cross-sectional views illustrating a method for forming a semiconductor device having an EDMOS transistor according to embodiments.

Figure 5:
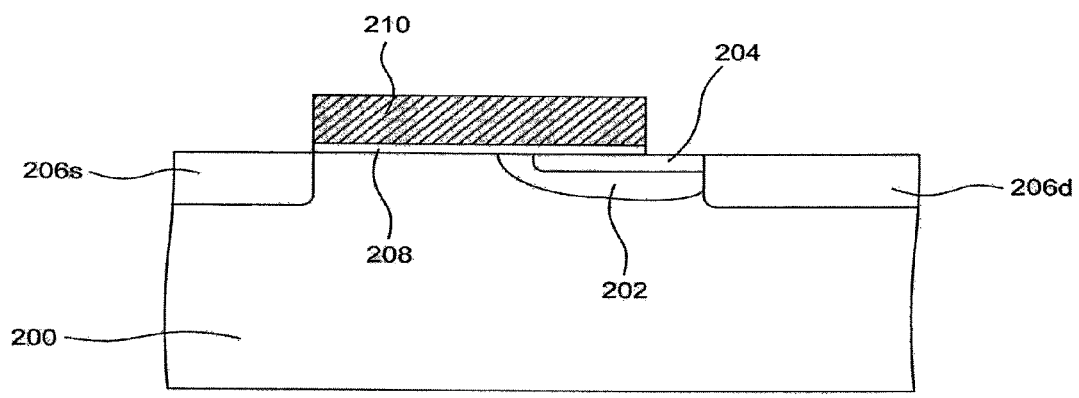

Example FIG. 5 is a cross-sectional view illustrating a semiconductor device having an EDMOS transistor according to embodiments.

Figure 6:
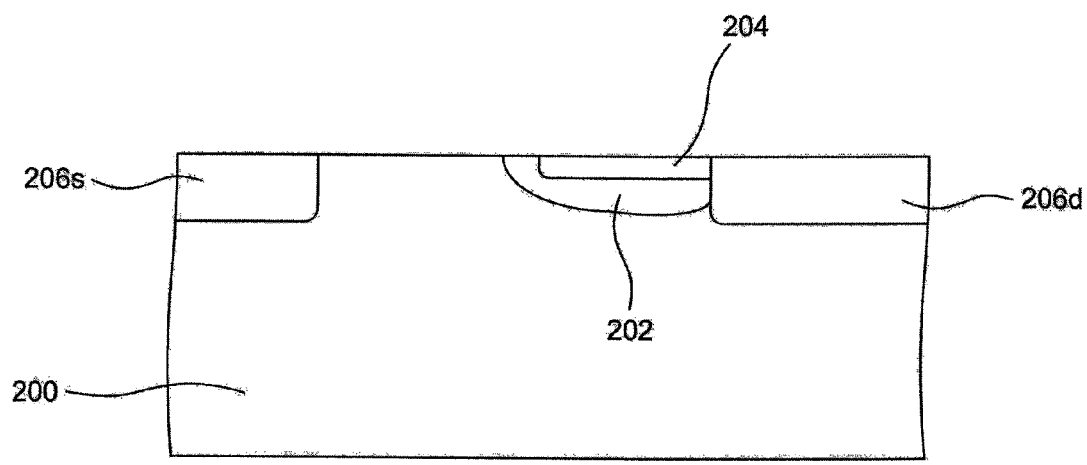

Example FIG. 6 is a cross-sectional view illustrating a method for forming a semiconductor device having an EDMOS transistor according to embodiments.

DESCRIPTION

Example FIG. 2 is a cross-sectional view illustrating a semiconductor device having an EDMOS transistor according to embodiments. As shown in example FIG. 2, a first gate insulating layer 104 fills a trench 102 formed in a specific region of a semiconductor substrate 100. In embodiments, the trench 102 may have a rounded shape. In embodiments, the trench 102 may have a depth of about 2000 Å to about 8000 Å from the top surface of the semiconductor substrate 100. A source region 108s and a drain region 108d are formed in the semiconductor substrate 100 at both sides of the first gate insulating layer 104. The source region 108s is separated from the first gate insulating layer 104 and the drain region 108d is adjacent to the first gate insulating layer 104. A doped drift region 106 is formed in the semiconductor substrate 100 under the first gate insulating layer 104. The doped drift region 106 may be in contact with the drain region 108d. The drain region 108d, the source region 108s, and the doped drift region 106 have been doped with the same type of impurities. In embodiments, the doped drift region 106 may have a lower impurity concentration than that of the drain region 108d. The source and drain regions 108s and 108d may have the same impurity concentration.

A second gate insulating layer 110 is formed over the semiconductor substrate 100 between the source region 108s and the trench 102, i.e., the first gate insulating layer 104. The second gate insulating layer 110 is in contact with a portion of the first gate insulating layer 104. The first gate insulating layer 104 may include an oxide layer. Particularly, the first gate insulating layer 104 may include a Chemical Vapor Deposition (CVD) oxide layer. The second gate insulating layer 110 may also include an oxide layer. Particularly, the second gate insulating layer 110 may include a thermal oxide layer.

A gate electrode 112 is formed over the first and second gate insulating layers 104 and 110. The gate electrode 112 may cover the entire surface of the second gate insulating layer 110 positioned over the semiconductor substrate 100 between the source region 108s and the trench 102. In contrast, the gate electrode 112 may cover only a part of the first gate insulating layer 104. Particularly, the gate electrode 112 may cover a part of the first gate insulating layer 104 adjacent to the second gate insulating layer 110. Accordingly, the gate electrode 112 and the drain region 108d are separated from each other. The gate electrode 112 includes a conductive material. For example, the gate electrode 112 may include at least one material selected from the group consisting of doped polysilicon, a metal such as tungsten or molybdenum, a metal silicide such as tungsten silicide or cobalt silicide, and a conductive metal nitride such as titanium nitride or tantalum nitride.

In the EDMOS transistor constructed as described above, the first gate insulating layer 104 fills the trench 102 formed in the semiconductor substrate 100. This significantly reduces the planar area of the first gate insulating layer 104, compared to that of a gate oxide layer formed using the related LOCOS process. This leads to a reduction in the planar area of the EDMOS transistor, thereby achieving more highly integrated semiconductor devices.

Example FIGS. 3 and 4 are cross-sectional views illustrating a method for forming a semiconductor device having an EDMOS transistor according to embodiments. As shown in example FIG. 3, a hard mask pattern 101 having an opening is formed over a semiconductor substrate 100. The opening exposes a specific region of the semiconductor substrate 100. The hard mask pattern 101 may include a material (for example, a nitride layer) having a varying etch selectivity with respect to the semiconductor substrate 100.

The exposed semiconductor substrate 100 is etched using the hard mask pattern 101 as a mask to form a trench 102. In embodiments, the trench 102 may be formed in a rounded shape. In embodiments, the trench 102 may be formed to a maximum depth of about 2000 Å to about 8000 Å from the top surface of the semiconductor substrate 100.

As shown in example FIG. 4, an insulating layer is formed over the semiconductor substrate 100 to fill the trench 102 and is then planarized until the hard mask pattern 101 is exposed, thereby forming a first gate insulating layer 104. The hard mask pattern 101 is then removed. An upper portion of the first gate insulating layer 104 may be etched when the hard mask pattern 101 is removed.

First impurity ions are selectively implanted to form a doped drift region 106 in the semiconductor substrate 100 under the first gate insulating layer 104. Second impurity ions are selectively implanted to form a drain region 108d and a source region 108s in the semiconductor substrate 100 at both sides of the first gate insulating layer 104. The first and second impurity ions are of the same type. The drain region 108d may be in contact with the doped drift region 106 and the source region 108s may be separated from the first gate insulating layer 104.

A second gate insulating layer 110 is formed over the semiconductor substrate 100 including the doped drift region 106 and the source and drain regions 108s and 108d. The second gate insulating layer 110 may be formed of a thermal oxide layer as described above. The second gate insulating layer 110 may be thinner than the first gate insulating layer 104.

A gate conducting layer is formed over the entire surface of the semiconductor substrate 100 including the first and second gate insulating layers 104 and 110 and is then patterned to form the gate electrode 112 shown in example FIG. 2. Portions of the second gate insulating layer 110 at both sides of the gate electrode 112 may be removed so that the source and drain regions 108s and 108d are exposed.

Example FIG. 5 is a cross-sectional view illustrating a semiconductor device having an EDMOS transistor according to embodiments. As shown in example FIG. 5, a doped drift region 202 is formed in a specific region of a semiconductor substrate 200. The substrate may be doped with a first conductivity type impurity. The doped drift region 202 may be doped with a second conductivity type impurity. A source region 206s and a drain region 206d are formed in the semiconductor substrate 200 at both sides of the doped drift region 202. The source and drain regions 206s and 206d may be doped with the second conductivity type impurity. The source region 206s may be horizontally separated from the doped drift region 202. In contrast, the drain region 206d is adjacent to the doped drift region 202 so that they may be in contact with each other.

A count doped region 204 is formed in the doped drift region 202. Side and bottom surfaces of the count doped region 204 are surrounded by the doped drift region 202. The count doped region 204 is doped with the first conductivity type impurity. That is, the semiconductor substrate 200 and the count doped region 204 are doped with the first conductivity type impurity and the source region 206s, the drain region 206d, and the doped drift region 202 are doped with the second conductivity type impurity. For example, the first conductivity type impurity may be an n-type impurity and the second conductivity type impurity may be a p-type impurity. Alternatively, the first conductivity type impurity may be a p-type impurity and the second conductivity type impurity may be an n-type impurity.

A gate insulating layer 208 and a gate electrode 210 are sequentially deposited over the semiconductor substrate 200 between the source region 206s and the drain region 206d. The gate electrode 210 may cover the entire surface of the semiconductor substrate 200 between the source region 206s and the doped drift region 202. The gate electrode 210 may additionally cover a part of the doped drift region 202 and a part of the count doped region 204. The gate electrode 210 has first and second sidewalls opposite to each other. The first sidewall of the gate electrode 210 is near the source region 206s and the second sidewall of the gate electrode 210 is near the drain region 206d. The second sidewall of the gate electrode 210 may be horizontally separated from the drain region 206d.

The EDMOS transistor constructed as described above has the count doped region 204. When a high voltage is applied to the drain region 206d, the count doped region 204 reduces the electric field between the gate electrode 210 and the drain region 206d, thereby improving breakdown voltage characteristics between the gate electrode 210 and the drain region 206d. In addition, the count doped region 204 has a very small planar area. For example, even though the planar area of the count doped region 204 is reduced to between about 20% and 50% of that of a gate oxide layer formed through the related LOCOS process, the breakdown voltage characteristics are the same as those of the gate oxide layer. As a result, the planar area of the EDMOS transistor can be minimized to achieve more highly integrated semiconductor devices.

Example FIG. 6 is a cross-sectional view illustrating a method for forming a semiconductor device having an EDMOS transistor according to embodiments. As shown in example FIG. 6, first impurity ions using a second conductivity type impurity are selectively implanted into a semiconductor substrate 200 doped with a first conductivity type impurity to form a doped drift region 202 in the semiconductor substrate 200. Second impurity ions using the second conductivity type impurity are selectively implanted into the semiconductor substrate 200 to form a source region 206s and a drain region 206d in the semiconductor substrate 200 at both sides of the doped drift region 202. The source region 206s is horizontally separated from the doped drift region 202 and the drain region 206d is in contact with the doped drift region 202. Third impurity ions using the first conductivity type impurity are selectively implanted into the semiconductor substrate 200 to form a count doped region 204. Here, the count doped region 204 is formed in the doped drift region 202. The implantation of third impurity ions to form the count doped region 204 may be performed after or before the implantation of second impurity ions is performed to form the source and drain regions 206s and 206d.

In the case where the first conductivity type impurity is a p-type impurity and the second conductivity type impurity is an n-type impurity, the implantation of third impurity ions to form the count doped region 204 may be performed by implanting B or $BF_2$ with an energy of about 1 to 2000 KeV. This process may be performed with an ion dose of about $10^{11}$ to about $10^{16}$ atoms/cm$^2$ and an ion injection angle of 0° to about 60°.

In the case where the first conductivity type impurity is an n-type impurity and the second conductivity type impurity is a p-type impurity, the implantation of third impurity ions to form the count doped region 204 may be performed by implanting P or As with an energy of about 1 to 2000 KeV. This process may be performed with an ion dose of about $10^{11}$ to about $10^{16}$ atoms/cm$^2$ and an ion injection angle of 0° to about 60°.

A gate insulating layer 208 and a gate electrode 210 shown in example FIG. 5 are then formed over the semiconductor substrate 200 including the source and drain regions 206s and 206d, the doped drift region 202, and the count doped region 204.

As is apparent from the above description, for example, a gate insulating layer is formed over a doped drift region with filling a trench. This allows formation of an EDMOS transistor having a smaller planar area than an EDMOS transistor with a gate oxide layer formed using the related LOCOS process, thereby achieving more highly integrated semiconductor devices.

Alternatively, a count doped region may be formed in the doped drift region, instead of forming a gate oxide layer over it using the related LOCOS process. The count doped region is doped with a different type of impurity from that of the doped drift region. The planar area of the count doped region is significantly reduced compared to that of the gate oxide layer formed using the related LOCOS process. This leads to a reduction in the planar area of the EDMOS transistor, thereby achieving more highly integrated semiconductor devices.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a trench in a specific region of a semiconductor substrate using a hard mask pattern formed on the semiconductor substrate as an etch mask, wherein the trench is formed from a top surface of the semiconductor substrate to a maximum depth of about 2000 Å to about 8000 Å;
    forming a first gate insulating layer which fills the trench;
    forming a doped drift region in the semiconductor substrate under the first gate insulating layer;
    forming a source region and a drain region in the semiconductor substrate at both sides of the first gate insulating layer, the source region being separated from the first gate insulating layer and the drain region being in contact with the doped drift region;
    forming a second gate insulating layer over the semiconductor substrate between the first gate insulating layer and the source region, wherein the doped drift region is separate from the second gate insulating layer; and forming a gate electrode over the first and second gate insulating layers, wherein said forming a first gate insulating layer comprises:

forming an insulating layer formed over the semiconductor substrate to fill the trench;

planarizing the insulating layer until the hard mask pattern is exposed; and etching an upper portion of the first gate insulating layer when removing the hard mask pattern.

2. The method of claim 1, wherein the trench is formed in a rounded shape.

3. The method of claim 1, wherein the gate electrode is formed to cover only a portion of the first gate insulating layer which is adjacent to the second gate insulating layer.

4. The method of claim 1, wherein the doped drift region is formed to have a lower impurity concentration than the drain region.

5. The method of claim 1, wherein the second gate insulating layer is thinner than the first gate insulating layer.

* * * * *